United States Patent
Rabbers et al.

(10) Patent No.: US 10,027,137 B2
(45) Date of Patent: Jul. 17, 2018

(54) ENERGY STORAGE DEVICE (71) Applicant: Siemens Aktiengesellschaft, Munich (DE)

(72) Inventors: Jacob Johan Rabbers, Baiersdorf (DE); Barbara Schricker, Erlangen (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 148 days.

(21) Appl. No.: 15/024,120

(22) PCT Filed: Sep. 11, 2014

(86) PCT No.: PCT/EP2014/069348
§ 371 (c)(1),
(2) Date: Mar. 23, 2016

(87) PCT Pub. No.: WO2015/043965
PCT Pub. Date: Apr. 2, 2015

(65) Prior Publication Data
US 2016/0211679 A1 Jul. 21, 2016

(30) Foreign Application Priority Data
Sep. 26, 2013 (DE) .......... 10 2013 219 360

(51) Int. Cl.
H02J 7/00 (2006.01)
G01R 31/36 (2006.01)
(Continued)

(52) U.S. Cl.
CPC .......... *H02J 7/0021* (2013.01); *G01R 31/362* (2013.01); *G01R 31/3624* (2013.01);
(Continued)

(58) Field of Classification Search
USPC ................. 320/103, 128, 166, 167
See application file for complete search history.

(56) References Cited

U.S. PATENT DOCUMENTS

| 9,620,969 B2* | 4/2017 | Kobayashi | ............ H02J 7/0016 |
| 2008/0048499 A1* | 2/2008 | Litovsky | ................. H02J 7/345 |
| | | | 307/45 |

(Continued)

FOREIGN PATENT DOCUMENTS

| DE | 1421615 A1 | 11/1968 | ............. G01R 31/36 |
| DE | 102007038532 A1 | 2/2009 | ......... G01R 31/3658 |

(Continued)

OTHER PUBLICATIONS

European Notice of Allowance, Application No. 14771821.7, 9 pages, dated Sep. 5, 2017.

(Continued)

*Primary Examiner* — Brian Ngo
(74) *Attorney, Agent, or Firm* — Slayden Grubert Beard PLLC (57) ABSTRACT An energy storage device includes a battery with at least one battery cell and two poles, two connection points each connected to battery pole, for connecting to an external current circuit for charging and discharging the battery, a battery charge state monitoring device, an additional energy storage element different than the battery cell, a connection circuit for connecting the additional energy storage element to at least one battery pole, and at least one connection point. The connection circuit is designed such that a specified energy storage element current having a specified relationship with the total current flowing through the energy storage device is charged into and/or discharged from the energy storage element. A voltage measuring device contacts the additional energy storage element to measure an energy storage voltage, and the charge state monitoring (Continued)

device determines the charge state of the battery based at least on the energy storage voltage.

16 Claims, 4 Drawing Sheets

(51) Int. Cl.

| | | |
|---|---|---|
| *H01M 10/48* | (2006.01) | |
| *H01M 10/42* | (2006.01) | |
| *H01M 16/00* | (2006.01) | |
| *H01M 10/46* | (2006.01) | |
| *H01M 10/44* | (2006.01) | |
| H02J 7/04 | (2006.01) | |
| H01G 11/08 | (2013.01) | |
| H02J 7/34 | (2006.01) | |

(52) U.S. Cl.
CPC ..... *H01M 10/425* (2013.01); *H01M 10/4264* (2013.01); *H01M 10/44* (2013.01); *H01M 10/46* (2013.01); *H01M 10/48* (2013.01); *H01M 16/00* (2013.01); *H02J 7/008* (2013.01); *H02J 7/0045* (2013.01); *H02J 7/0083* (2013.01); *G01R 31/3631* (2013.01); *H01G 11/08* (2013.01); *H02J 7/045* (2013.01); *H02J 7/345* (2013.01); *H02J 2007/005* (2013.01)

(56) References Cited

U.S. PATENT DOCUMENTS

| | | | | |
|---|---|---|---|---|
| 2008/0290842 A1* | 11/2008 | Davis | ........................ | B60L 7/24 320/166 |
| 2009/0110214 A1* | 4/2009 | Litovsky | ............... | H02J 7/0004 381/106 |
| 2010/0225325 A1 | 9/2010 | Christensen et al. | ......... | 324/426 |
| 2012/0139495 A1* | 6/2012 | Nortman | ............... | H02J 7/0016 320/128 |
| 2013/0045404 A1 | 2/2013 | Shi | ................... | 429/93 |
| 2013/0124029 A1 | 5/2013 | Izumi | ............... | 701/22 |
| 2013/0134908 A1 | 5/2013 | Sugiyama et al. | ................ | 318/3 |
| 2014/0117863 A1* | 5/2014 | He | ......................... | H05B 41/34 315/173 |

FOREIGN PATENT DOCUMENTS

| | | | | |
|---|---|---|---|---|
| DE | 102011080603 A1 | 2/2013 | ........... | B60R 16/033 |
| DE | 102012003100 A1 | 2/2013 | ............. | G01R 31/36 |
| DE | 102012206893 A1 | 10/2013 | ............. | G01R 31/36 |
| GB | 948428 A | 2/1964 | ............. | G01R 31/36 |
| JP | 55150567 A | 11/1980 | ............ | H01M 10/44 |
| JP | 08315793 A | 11/1996 | ............ | H01M 10/48 |
| JP | 2001086604 A | 3/2001 | ............... | B60K 6/20 |
| JP | 2008260346 A | 10/2008 | ............... | B60K 6/28 |
| JP | 2011086530 A | 4/2011 | ............. | G01R 31/36 |
| JP | 2011099762 A | 5/2011 | ............. | G01R 31/36 |
| WO | 2013/159979 A1 | 10/2013 | ............. | G01R 31/36 |
| WO | 2015/043965 A1 | 4/2015 | ............. | G01R 31/36 |

OTHER PUBLICATIONS

German Search Report, Application No. 102013219360.2, 8 pages, dated Jun. 10, 2014.

International Search Report and Written Opinion, Application No. PCT/EP2014/069348, 41 pages, dated Mar. 10, 2015.

Japanese Office Action, Application No. 2016517469, 4 pages, dated Jun. 5, 2017.

European Search Report, Application No. 17001635.6, 6 pages, dated Jan. 2, 2018.

\* cited by examiner

FIG 8

ENERGY STORAGE DEVICE

CROSS-REFERENCE TO RELATED APPLICATIONS

This application is a U.S. National Stage Application of International Application No. PCT/EP2014/069348 filed Sep. 11, 2014, which designates the United States of America, and claims priority to DE Application No. 10 2013 219 360.2 filed Sep. 26, 2013, the contents of which are hereby incorporated by reference in their entirety.

TECHNICAL FIELD

The invention relates to an energy storage device comprising a battery having at least one battery cell and two poles, two terminal points, which are connected directly or indirectly to a respective pole of the battery, for connection to an external electrical circuit for charging and discharging the battery, and a state of charge monitoring device for determining a state of charge of the battery.

BACKGROUND

The state of charge of electrochemical energy stores such as lithium-ion batteries, for example, is a fundamental state variable required for indicating the state of charge and for controlling the charging and/or discharging of the store. For reliable operation of an energy storage device, the state of charge has to be determined sufficiently accurately. In practice, however, precisely the determination of the state of charge, particularly in the case of batteries having a flat characteristic curve, such as batteries based on e.g. lithium iron phosphate cells, poses a particular difficulty. A flat characteristic curve means that for a large portion of the states of charge the battery voltage is not dependent on the state of charge or is only very slightly dependent thereon. Therefore, if the state of charge of the battery is intended to be determined by a measurement of the voltage dropped across the battery, the determined state of charge is highly prone to errors on account of this low dependence. During operation, inaccurate state of charge values have the effect that either it is not possible to utilize the entire storage capacity of the battery or even disturbing emergency shutdowns of a system operated with the energy storage device are carried out by the battery management system if voltage limits of the battery are reached.

States of charge have been determined hitherto by the combination of two mutually complementary methods. In the case where currents not equal to zero flow, the state of charge determination is realized by means of charge counters. In this case, the current with which the energy storage device is charged and/or discharged is measured and integrated over time. In combination with a well-defined initial value, the present state of charge is in each case calculated by this means. Inaccuracies in the current measurement, such as e.g. an offset, are integrated over time in this case and can lead to significant deviations from the actual state of charge.

In order to correct this deviation, therefore, the state of charge is additionally determined by means of the quiescent voltage of the energy storage device. However, even in the case of energy storage devices having steep characteristic curves, the relationship between battery voltage and state of charge is provided only if the battery is quiescent, that is to say that no current flows into or out of the battery, over a relatively long period of time, for example 15 minutes. With current not equal to zero, by contrast, the voltage deviates from the quiescent voltage upward or downward depending on the current direction. In this case, this deviation is dependent on numerous factors, in particular the retention profile and temperature. The described correction of the state of charge can therefore be carried out only in periods of time in which the energy storage device is neither charged nor discharged. Since these periods of time are temporally spaced, these corrections generally lead to jumps in the determined state of charge.

The corrections described prove moreover to be significantly more difficult in the case of batteries having a flat characteristic curve. In the case of such stores, the dependence of the quiescent voltage on the state of charge in a large range is too low to be able to carry out a reliable determination of the state of charge. A quiescent voltage correction, as described above, is therefore not possible in the case of these batteries. The state of charge calculated by the charge counter therefore becomes more and more inaccurate over the course of time, as described above, for which reason the state of charge has to be calibrated from time to time. This is possible, for example, by the battery being fully charged and the charge counter being set to 100%. During this process, however, the battery typically cannot be used since charging the battery to 100% is carried out according to a defined procedure. The process may therefore be performed when the store need not be ready for use. If such a calibration is not possible over a relatively long period of time, it is possible that the operation of the battery must be interrupted for the purpose of calibration.

SUMMARY

Some embodiments provide an energy storage device comprising a battery having at least one battery cell and two poles, two terminal points, which are connected directly or indirectly to a respective pole of the battery, for connection to an external electrical circuit for charging and discharging the battery, and a state of charge monitoring device for determining a state of charge of the battery, wherein the energy storage device comprises at least one additional energy storage element embodied differently than the battery cell, and a connection circuit for directly or indirectly connecting the energy storage element to at least one of the poles of the battery and at least one terminal point, where the connection circuit is embodied and contacted in such a way that the energy storage element is charged and/or discharged with an energy storage element current that is in a predefined ratio to the total current through the energy storage device, wherein a voltage measuring device contacts the additional energy storage element in order to measure the energy storage voltage dropped across the energy storage element and the state of charge monitoring device is designed for determining the state of charge of the battery depending at least on the energy storage voltage.

In one embodiment, the connection circuit is embodied and contacted in such a way that the total current in defined fractions originates from the battery and the energy storage element and/or is fed to them.

In one embodiment, the connection circuit comprises at least one first, one second and one third connection contact and with the first connection contact and the second connection contact is connected in series between one of the poles of the battery and the terminal point connected to it and with the third connection contact directly or indirectly contacts the energy storage element.

In one embodiment, the third connection contact and the second or a fourth connection contact directly or indirectly contact in each case one of the poles of the energy storage element.

In one embodiment, the connection circuit comprises a current measuring device for measuring a battery current flow between the first and second connection contacts.

In one embodiment, the connection circuit has a current source and/or a current sink between the third connection contact and the second or fourth connection contact, wherein the current source and/or the current sink are/is controllable depending on the battery current flow.

In one embodiment, the connection circuit comprises a current measuring device for measuring the battery current flow between the first and second connection contacts and a current control element, which determines the current flow through the current control element depending on the battery current flow, between the third connection contact and the second or a fourth connection contact.

In one embodiment, the current control element and/or the current measuring device comprise(s) at least one transistor.

In one embodiment, the connection circuit is embodied as a current mirror, wherein a current flow between the third connection contact and the second or the fourth connection contact is determined by a current flow between the first connection contact and the second connection contact.

In one embodiment, the connection circuit is a DC voltage converter or comprises a DC voltage converter.

In one embodiment, the connection circuit galvanically isolates the battery from the energy storage element.

In one embodiment, the energy storage element is connected in series with the battery.

In one embodiment, a plurality of energy storage elements are connected in parallel with one another.

In one embodiment, the state of charge monitoring device is designed to store a plurality of temporally spaced voltage measurement values and/or determined states of charge of the battery and/or of the energy storage element and to take them into account in the calculation of the state of charge of the battery.

In one embodiment, the energy storage device comprises a current measuring device for measuring an actual current variable for the current flow through the energy storage device and/or the battery and/or the energy storage element, wherein the state of charge monitoring device is designed for taking account of the actual current variable and/or for storing actual current variables and for taking account of temporally preceding actual current variables in the calculation of the state of charge of the battery and/or of the energy storage element.

In one embodiment, the voltage dropped across the energy storage element for at least one range of the states of charge of the energy storage element has a greater dependence on the state of charge of the energy storage element than the dependence of the voltage dropped across the battery on the state of charge of the battery in the equivalent charging range of the battery.

In one embodiment, the further energy storage element is an electrochemical storage cell or a capacitor or a supercapacitor.

In one embodiment, the supercapacitor is a double-layer capacitor, a hybrid capacitor or a pseudocapacitor.

BRIEF DESCRIPTION OF THE DRAWINGS

Example embodiments and aspects of the invention are discussed in more detail below with reference to the drawings, in which.

DETAILED DESCRIPTION

Embodiments of the invention provide an energy storage device which, particularly with the use of a battery having a flat charging curve, allows an improved state of charge determination.

Some embodiments provide an energy storage device that comprises at least one additional energy storage element embodied differently than the battery cell, and a connection circuit for directly or indirectly connecting the energy storage element to at least one of the poles of the battery and at least one terminal point, where the connection circuit is embodied and contacted in such a way that the energy storage element is charged and/or discharged with a energy storage element current that is in a predefined ratio to the total current through the energy storage device, wherein a voltage measuring device contacts the additional energy storage element in order to measure the energy storage voltage dropped across the energy storage element and the state of charge monitoring device is designed for determining the state of charge of the battery depending at least on the energy storage voltage.

Some embodiments are based on the concept of not measuring the state of charge directly by a voltage measurement at the battery, but rather measuring the voltage at a further energy storage element, which is charged and/or discharged with an energy storage element current that is in a predefined ratio to the total current through the energy storage device. This procedure is particularly advantageous if a battery is used which has a relatively flat characteristic curve, as a result of which, as described in the introduction, it is not possible to determine the battery charge with sufficient accuracy by measuring the voltage dropped across the battery. Moreover, it is advantageous that, if the further energy storage element is charged and/or discharged only with a relatively small fraction of the total current, the voltage dropped across the energy storage element may be significantly less dependent on the loading of the energy storage device than the voltage dropped across the battery. In the disclosed energy storage device it may thus be possible to determine the state of charge of the battery even during the loading of the energy storage device.

Before the energy storage device is used, the battery and the energy storage element can be brought to a defined state of charge. In this case, it is particularly advantageous if the ratio of the energy storage element current to the total current is chosen such that the energy storage element can be charged and/or discharged in parallel over the entire possible charge range of the battery. Therefore, the charge that can be stored in the energy storage element should be chosen at least with a magnitude such that the ratio of the charge that can be stored in the energy storage element to the charge that can be stored in the battery is at least of the same magnitude as the ratio of the energy storage element current to the current with which the battery is charged and/or discharged. The energy storage element is connected to the battery and at least one of the terminal points via a connection circuit. In this case, the connection circuit can either directly conductively contact at least one pole of the energy storage element and the at least one pole of the battery and at least one terminal point, or the connection can be effected indirectly via at least one further component.

In this case, the energy storage element current can be part of the total current. The connection circuit can therefore be embodied and contacted in such a way that the total current in defined fractions originates from the battery and the energy storage element and/or is fed to them. Alternatively, however, it is also possible for the battery and the energy storage element to be arranged in separate electrical circuits and for a component of the connection circuit to couple said electrical circuits in such a way that it is possible to transfer electrical energy between the electrical circuits and this energy transfer is controlled depending on the total current in such a way that the energy storage element current is in a predefined ratio to the total current.

In the simplest case, the connection circuit can comprise respectively a conductive connection, for example by conductor tracks, between a first one of the poles of the energy storage element and one of the poles of the battery and between a second one of the poles of the energy storage element and one of the terminal points. However, the connection circuit can also comprise active or passive components. In particular, the connection circuit can comprise at least one first, one second and one third connection contact and with the first connection contact and the second connection contact can be connected in series between one of the poles of the battery and the terminal point connected to it and with the third connection contact can directly or indirectly contact the energy storage element. What is achieved by the series connection between battery and connection circuit, in which for example the first connection contact is connected to one of the poles of the battery and the second connection contact is connected to the assigned terminal point, is that the entire current flow from or to the battery is passed through the connection circuit. The current flow between the first and second connection contacts thus corresponds to the current flow to and/or from the battery.

The third connection contact directly or indirectly contacts one of the poles of the energy storage element. In this case, it is possible for the third connection contact and the second or a fourth connection contact to directly or indirectly contact in each case one of the poles of the energy storage element. Alternatively, the third connection contact can also directly or indirectly contact one of the poles of the energy storage element and the further pole of the energy storage element can be directly or indirectly connected to the further pole of the battery. In both embodiments, the energy storage element current can correspond to the current that flows through the third connection contact. In this case, the current flow through the third connection contact can be predefined directly by the connection circuit. In this case, the current flow through the third connection contact and thus the energy storage element current is intended to be predefined in such a way that it is proportional to the total current through the energy storage device.

In order to achieve this, the connection circuit can comprise a current measuring device for measuring the battery current flow between the first and second connection contacts. The current measuring device can comprise, in particular, a resistor connected between the first and second connection contacts and a voltage measuring device for measuring the voltage dropped across said resistor. The voltage measuring device can be embodied in the form of an instrument amplifier, to which the voltage present at the resistor on the battery side is fed at the first of its inputs and the voltage present at the resistor on the terminal point side is fed at the second of its inputs. A voltage signal proportional to the current flow between the first and second connection contacts is thus provided at the output of the instrument amplifier. Said voltage signal can then be used for controlling further elements of the connection circuit.

The connection circuit can additionally have a current source and/or a current sink between the third connection contact and the second or fourth connection contact, wherein the current source and/or the current sink are/is controllable depending on the battery current flow. This is possible in a particularly simple manner if, as described above, a voltage signal proportional to the current flow between the first and second connection contacts is present in the connection circuit. The current source and/or current sink can then be embodied in particular as a voltage-controlled current source or current sink. In this case, in particular, a two-quadrant or four-quadrant current source can be used, which can serve both as current source, that is to say makes energy available to a circuit, and as a current sink, that is to say takes up energy from the circuit.

In this case, in the disclosed energy storage device, the energy supply of the two- or four-quadrant current source can be carried out in particular by the energy storage device itself. In this case, the supply can be carried out by supply lines that are directly connected to the terminal points. In this case, the energy storage element current fed to or drawn from the energy storage element by the two- or four-quadrant current source contributes to the total current and this achieves the effect that the total current in defined fractions originates from the battery and the energy storage element and/or is fed thereto.

Alternatively, the connection circuit can comprise a current measuring device for measuring the battery current flow between the first and second connection contacts and a current control element, which determines the current flow through the current control element depending on the battery current flow, between the third connection contact and the second or a fourth connection contact. The current flow through the third connection contact and thus the energy storage element current is thus once again determined depending on the current flow between the first and second connection contacts and thus depending on the current flow into or out of the battery.

Current control elements such as transistors can typically only control a current flow if a voltage is dropped across the current control element. If the current control element thus directly controls the current flow between the third and second connection contacts or if the fourth connection contact and the second connection contact are connected with low impedance, in the case described the voltage drop between the third connection contact and the second connection contact must be greater than the voltage drop between the first connection contact and the second connection contact. If no additional components such as DC voltage converters or the like are used, in this case the battery voltage would have to be less than the voltage dropped across the energy storage element in the event of discharging of the battery and greater than the voltage dropped across the energy storage element in the event of charging of the battery. In order to be able to use the connection circuit both for charging and for discharging the battery and nevertheless to ensure that the energy storage element current is in a predefined ratio to the total current, it is therefore advantageous to supplementarily provide a further current measuring device between the second or fourth connection contact and the third connection contact and a further current control element between the second connection contact and the first connection contact. Moreover, it is advantageous if the battery and the energy storage element are chosen in such a way that in all states of charge used either the voltage dropped across the battery is greater than the voltage dropped across the energy storage element or vice versa. A greater flexibility in the choice of the battery and the energy storage element can be achieved by virtue of a DC voltage converter being arranged between battery or energy storage element and the respectively assigned current control element, in order to increase or decrease the corresponding voltage.

In this case, the current control element and/or the current measuring device can comprise at least one transistor. In this regard, transistors, if they are not operated at saturation, behave on the output side like a current source that is controlled depending on a base or gate voltage. At the same time, however, it is also possible, in particular by means of a feedback of the base or gate to the collector or to the source terminal, respectively, to use a transistor as a current measuring device. In this case, in particular, structurally identical transistors can be used as current control element and current measuring device. The structurally identical transistors may in particular both be parts of an integrated circuit.

The connection circuit can be embodied as a current mirror, in particular, wherein a current flow between the third connection contact and the second or the fourth connection contact is determined by a current flow between the first connection contact and the second connection contact. As already explained, it is advantageous, if the connection circuit is intended to be used in the event of charging and discharging of the battery, to provide two current mirrors, wherein one of the current mirrors determines the energy storage element current depending on the battery current and the other of the current mirrors determines the battery current depending on the energy storage element current. In this case, the first connection contact can be connected to a first pole of the battery, the third connection contact can be connected to the first pole of the energy storage element and the second pole of the battery can be connected to the second pole of the energy storage element.

Alternatively, the connection circuit can be a DC voltage converter or comprise a DC voltage converter. In this case, the DC voltage converter can convert in particular between a voltage dropped between the first and second connection contacts and a voltage dropped between the third connection contact and the second or fourth connection contact. In particular, the energy storage element can in this case be directly or indirectly connected to the third connection contact and the fourth connection contact or the second connection contact, wherein an additional resistor can be arranged in particular between at least one of the poles of the energy storage element and one of the connection contacts. The additional resistor makes it possible here, in particular, for the DC voltage converter to function as a current source. The voltage dropped between the first and second connection contacts is proportional to the current flow. Thus, by using a DC voltage converter in the connection circuit, it is possible to achieve a fixed current ratio between the current flowing to the battery or from the battery and the energy storage element current, as a result of which the energy storage element current is in a predefined ratio to the total current. The use of a DC voltage converter is particularly advantageous here since the voltage dropped across the energy storage element can be chosen independently of the battery voltage, since the voltages can be matched by means of an appropriate clock ratio of the DC voltage converter. Moreover, it is possible for current or energy to be transported in both directions in the case of a DC voltage converter. Thus, a connection circuit having an individual DC voltage converter can be used both in the event of charging and in the event of discharging of the energy storage device.

It is possible, in principle, for the connection circuit to galvanically isolate the battery from the energy storage element. In this case, the energy storage element can be arranged in particular in a separate electrical circuit from the battery. The energy transfer between the electrical circuits can then be carried out in particular by means of an inversion of the current for example in a galvanically isolating DC voltage converter.

Alternatively, the energy storage element can be connected in series with the battery. A series connection of energy storage element and battery ensures that the energy storage element current is equal to the current that is fed to or drawn from the battery. Typically, the energy storage element has a lower capacity than the battery. Therefore, in the case of a series connection of energy storage element and battery, additional measures can be taken in order to be able still to utilize the full capacity of the battery.

In this case it is possible, as also in the other embodiments, for a plurality of energy storage elements to be connected in parallel with one another. In particular, energy storage elements having a relatively small voltage drop can be used. A relatively high capacity is achieved by means of the parallel connection of the storage elements. At the same time, the total voltage can be provided by a battery having a similar capacity but having a greater battery voltage.

Specifically for the case of a series connection of energy storage element and battery it is also possible, however, to form a bypass path for the current, via which a defined portion of the current is led past the energy storage element directly to or from the battery. For this purpose, it is possible to use all the described connection circuits which are embodied and contacted in such a way that they feed or draw a total current in defined fractions to or from the battery and the energy storage unit. Instead of the total current being divided between the energy storage unit and the battery, however, now the total current is divided between a series connection of energy storage unit and battery, on the one hand, and only the battery, on the other hand.

It is possible for the state of charge monitoring device to be designed to store a plurality of temporally spaced voltage values and/or determined states of charge of the battery and/or of the energy storage element and to take them into account in the calculation of the state of charge of the battery. This is advantageous since slight deviations from the predefined ratio between total current and energy storage element current can occur depending on the state of charge of the battery and/or of the energy storage element. If temporally preceding states of charge of the battery and/or of the energy storage element are detected and if calibration data for the energy storage device or a structurally identical energy storage device were detected at one time and stored in the state of charge monitoring device, then the actual state of charge can be reconstructed even in the event of stateof-charge-dependent deviations from the predefined ratio. In this case, it is possible for the correction of the state of charge to be carried out purely computationally, whereby a correct state of charge of the battery is determined, but the states of charge of battery and energy storage element can drift apart over time, for which reason a calibration of the energy storage devices should be carried out at certain time intervals. However, it is also possible for the energy storage device to comprise a charge transfer apparatus, in particular a DC voltage converter, which, in the case where a drifting apart of the states of charge of battery and energy storage element is ascertained, transfers a predefined amount of current from the battery into the energy storage element or vice versa.

Moreover, it is possible for the energy storage device to comprise a current measuring device for measuring an actual current variable for the current flow through the energy storage device and/or the battery and/or the energy storage element, wherein the state of charge monitoring device is designed for taking account of the actual current variable and/or for storing the actual current variable and for taking account of temporally preceding actual current variables in the calculation of the state of charge of the battery and/or of the energy storage element. This is advantageous since the actual ratio between total current and energy storage element current can differ from the predefined ratio depending on the loading of the energy storage device. By taking account of the actual current variable and/or the temporally preceding actual current variables, it is possible to take account of such deviations in the calculation of the state of charge of the battery. As described above, in this case, too, upon determination of drifting apart of the states of charge of battery and energy storage element, it is possible to transfer a defined amount of current from the battery into the energy storage device or vice versa.

In some embodiments the voltage dropped across the energy storage element for at least one range of the states of charge of the energy storage element has a greater dependence on the state of charge of the energy storage element than the dependence of the voltage dropped across the battery on the state of charge of the battery in the equivalent charging range of the battery. As already explained, it is problematic, in particular, to determine the state of charge of batteries having a flat characteristic curve by voltage measurement. If such a battery is intended to be used, an energy storage element having a steeper characteristic curve can advantageously be used in the energy storage device. The choice of the additional energy storage element can be made flexibly since, in the case of a correspondingly embodied connection circuit, both the voltage dropped across the energy storage element and the capacity of the energy storage element are selectable virtually as desired. In order to achieve good correspondence between the state of charge of the energy storage element and the battery over the long term, it is advantageous if an energy storage element having low self-discharge is chosen.

The energy storage element can be, for example, an electrochemical storage cell or a capacitor or a supercapacitor. The supercapacitor can be, for example, a double-layer capacitor, a hybrid capacitor or a pseudocapacitor.

Figure 1:
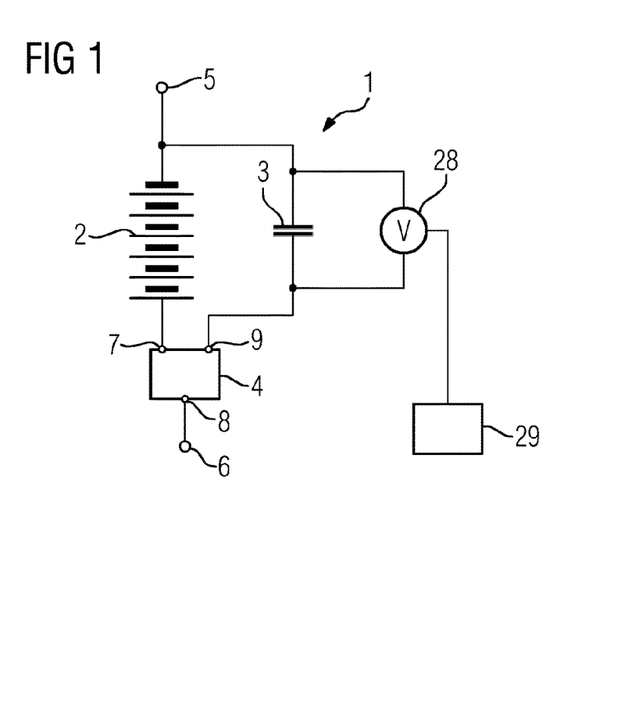
FIG. 1 schematically shows one example embodiment of an energy storage device according to the invention, FIG. 2 schematically shows a further example embodiment of an energy storage device according to the invention.

FIG. 1 shows an energy storage device 1 comprising a battery 2 and an additional energy storage element 3, which is embodied as a double-layer capacitor. The energy storage device 1 has a first terminal point 5 and a second terminal point 6 for connection to an electrical circuit. The connection between the battery 2 and the additional energy storage element 3 ensues directly on the side of the negative pole of the battery 2 and through the connection circuit 4 on the side of the positive pole of the battery 2. The connection circuit 4 has a first connection contact 7, a second connection contact 8 and a third connection contact 9.

The first connection contact 7 is directly connected to the negative pole of the battery 2, the second connection contact 8 is directly connected to the second terminal point 6, and the third connection contact 9 contacts the energy storage element 3. The connection circuit 4 is embodied here in such a way that the total current that flows via the terminal points 5, 6 and thus also via the connection contact 8 is divided in a predefined ratio between the battery 2 and the energy storage device 3 and thus between the connection contacts 7 and 9. Example embodiments of the connection circuit 4 are explained with reference to FIG. 5 and FIG. 6. The embodiments of a connection circuit explained in FIG. 3 and FIG. 4 can moreover be developed in such a way that they can also be used in the energy storage device 1 shown in FIG. 1.

The voltage dropped across the energy storage device 3 is measured by the voltage measuring device 28, and the voltage value determined is read out by the state of charge monitoring device 29. The voltage dropped across the energy storage element 3 is dependent on the state of charge of the energy storage element 3. Since the energy storage element current that charges and/or discharges the energy storage element 3 is proportional to the current that charges and/or discharges the battery, the state of charge of the energy storage element 3 and thus also the voltage dropped across the energy storage element 3 correlate with the state of charge of the battery 2. With the aid of a calibration data set determined in advance, the state of charge monitoring device 29 can thus calculate the state of charge of the battery 2 from the voltage measured by the voltage measuring device 28.

Figure 2:
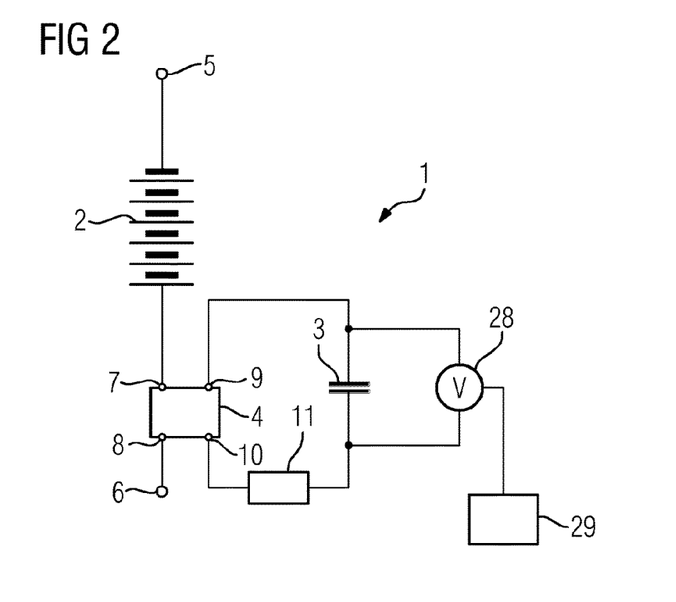

FIG. 2 shows a further example embodiment of an energy storage device. The energy storage device 1 differs from the energy storage device shown in FIG. 1 in the type of linking of the energy storage element 3. In FIG. 2 the poles of the energy storage element 3 are connected directly to the third connection contact 9 of the connection device 4 and, respectively, indirectly via the resistor 11 to the fourth connection contact 10 of the connection circuit 4. The connection circuit 4 is embodied in such a way that the current flow between the first and second connection contacts 7 and 8 is in a fixed ratio to the current flow between the third and fourth connection contacts 9, 10. In this case, the connection device 4 can be embodied such that the first and second connection contacts 7 and 8 are galvanically isolated from the third and fourth connection contacts 9 and 10. No DC current flow between the terminal points 5, 6 and the energy storage element 3 is possible in this case. Particularly by means of temporary inversion, however, it is nevertheless possible to transfer energy between the energy storage element 3 and a circuit connected at the terminal points 5, 6. Example embodiments for the connection circuit 4 are explained with reference to FIG. 3 and FIG. 4.

Figure 3:
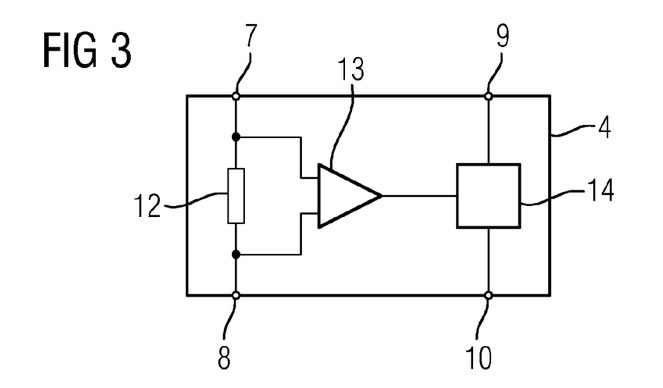
FIG. 3 shows one embodiment of the connection circuit shown in FIG. 2.

FIG. 3 shows one embodiment of the connection circuit 4 from FIG. 2, which can also be used in the embodiment of the energy storage device 1 as shown in FIG. 1 by virtue of the second and fourth connection contacts 8, 10 being connected. A resistor 12 of low resistance is arranged between the first and second connection contacts 7, 8, a voltage being dropped across said resistor depending on the current flowing between the first connection contact 7 and the second connection contact 8. The voltage dropped across the resistor 12 is amplified by the instrument amplifier 13 and fed as control voltage to the current source 14. The current source 14 is a four-quadrant current source which, independently of the voltage dropped between the third connection contact 9 and the fourth connection contact 10, depending on the output voltage of the instrument amplifier 13, can bring about a defined current flow between the third connection contact 9 and the fourth connection contact 10. Depending on the relative direction of current and voltage at the four-quadrant current source 14, the four-quadrant current source 14 in this case serves as a current source or as a current sink. The energy supply of the four-quadrant current source 14 is carried out by supply lines (not shown) that contact the terminal points 5, 6. Therefore, the energy required for the operation of the four-quadrant current source is drawn from the energy storage device and, in the case of operation as a current sink, the recovered energy is fed into the energy storage device. What can be achieved as a result is that the total current in defined proportions originates from the battery and the energy storage unit and/or is fed thereto.

Figure 4:
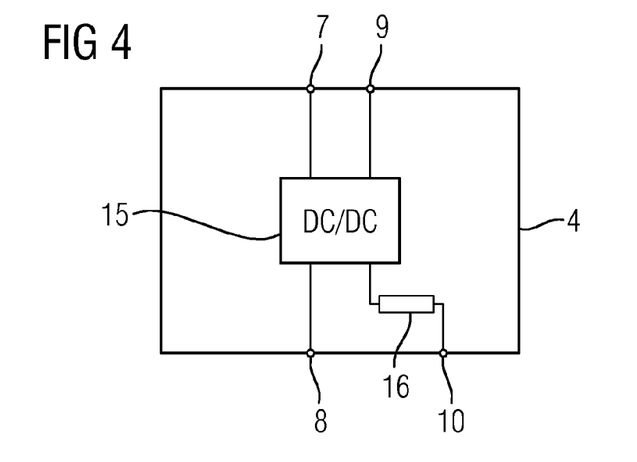
FIG. 4 shows a further embodiment of the connection circuit shown in FIG. 2.

FIG. 4 shows a further embodiment of the connection circuit 4, which can be used in the circuit 1 shown in FIG. 2. Use in the circuit 1 shown in FIG. 1 is possible for this connection circuit 4, too, if the second connection contact 8 is connected to the fourth connection contact 10. The connection circuit 4 comprises a DC voltage converter 15, which taps off the voltage between the first connection contact 7 and the second connection contact 8 as input voltage. The output voltage of the DC voltage converter 15 is directly connected to the third connection contact 9 on one side, and the reference point for the voltage output at the connection contact 9 is connected via a resistor 1 to the fourth connection contact 10. By virtue of the resistor 16 having a high resistance compared with an expected change in impedance of the further circuit, the DC voltage converter 15 can be regarded as a current source. In this case, the magnitude of the current that is output correlates with the voltage dropped between the first connection contact 7 and the second connection contact 8. However, said voltage is dependent on the current passed through the DC voltage converter 15. Thus, the current between the third connection contact 9 and the fourth connection contact 10 is also dependent on the current between the first connection contact 7 and the second connection contact 8. In this case, it may also be advantageous to provide an additional resistor between the first connection contact 7 and the second connection contact 8, in parallel with the DC voltage converter 15, in order to match the real part of the impedance between the first connection contact 7 and the second connection contact 8.

Figure 5:
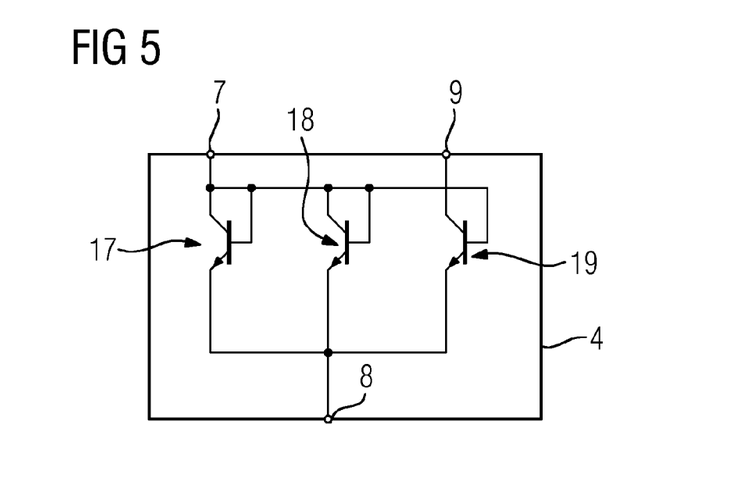
FIG. 5 shows one embodiment of the connection circuit shown in FIG. 1.

FIG. 5 shows one embodiment of the connection circuit 4 shown in FIG. 1. The connection circuit 4 is constructed as a current mirror comprising three transistors 17, 18 and 19. In this case, the base of all the transistors 17, 18, 19 and also the collector of the transistors 17, 18 are connected to the first connection contact 7, and the collector of the transistor 19 is connected to the third connection contact 9. The emitters of all the transistors 17, 18 and 19 feed the second connection contact 8. As a result of the feedback connection between base and collector of the transistors 17, 18, the latter function as a current-voltage converter, wherein the voltage between base and emitter in each case depends on the current flowing through the transistors 17, 18. This voltage corresponds to the voltage at the base of the transistor 19, as a result of which the transistor 19 is operated as a programmable current source through which flows exactly the same amount of current as flows through each of the transistors 17 and 18. The circuit shown thus serves as a current mirror, wherein the current flow between the third connection contact 9 and the second connection contact 8 is exactly half the magnitude of the current flow between the first connection contact 7 and the second connection contact 8. The division ratio can be adapted by the switching of further transistors that are switched like transistors 17, 18. In this case, it should be taken into consideration that the mirroring of the current of the transistors 17, 18 onto the transistor 19 can be carried out only if a voltage is dropped between collector and base at the transistor 19. Therefore, the voltage at the third connection contact 9 must always be higher than the voltage at the first connection contact 7. It is therefore necessary to choose the battery and the energy storage element correspondingly or alternatively to use an additional DC voltage converter in order always to fulfill this boundary condition.

Figure 6:
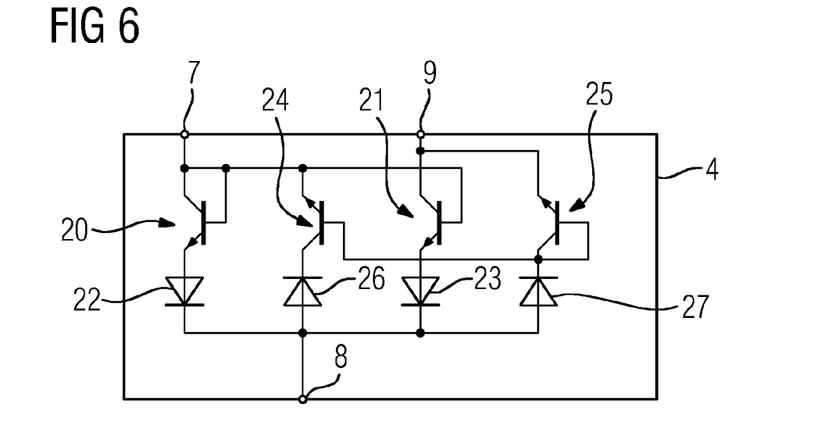
FIG. 6 shows a further embodiment of the connection circuit shown in FIG. 1.

The connection circuit 4 shown in FIG. 5 ensures a predefined ratio between energy storage element current and total current only in the event of discharging of the battery. FIG. 6 shows a further connection circuit 4, which ensures the predefined ratio between energy storage element current and total current both in the case of charging and in the case of discharging. In the connection circuit 4 shown, the current through the second connection contact 8 is composed in equal portions of the currents at the first connection contact 7 and at the third connection contact 9. This division ratio can be adapted, however, by the parallel use of a plurality of identically connected transistors such as is shown in FIG. 5. In the connection circuit 4, the transistors 20 and 21 are connected as a current mirror, as already explained with reference to FIG. 5. The diodes 22 and 23 are connected in series with the transistors 20 and 21 in order to prevent the corresponding circuit branches from being used in the event of charging of the energy storage device 1. Transistors 24 and 25 form a current mirror for the case where the voltage at the second connection contact 8 is higher than the voltage at the first connection contact 7 and respectively at the third connection contact 9. This situation occurs precisely when the energy storage device is being charged. The circuit branches of the transistors 24, 25 additionally comprise the diodes 26, 27 in order to ensure that the corresponding circuit branches are used only in the event of charging of the energy storage device 1.

Figure 7:
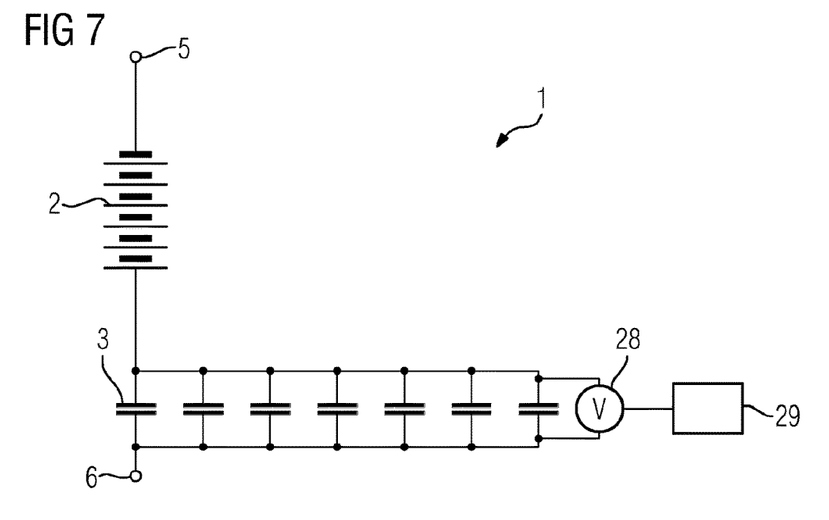
FIG. 7 shows a third example embodiment of an energy storage device according to the invention.

FIG. 7 shows a third example embodiment of an energy storage device comprising, besides the battery 2, a plurality of energy storage elements 3 which are connected in parallel with one another and in series with the battery 2. The parallel connection of the energy storage elements 3 results in a higher total capacity of the energy storage elements 3. Thus, each of the energy storage elements 3 has to provide only a fraction of the current that flows through the energy storage device. In this example embodiment, although a current that is equal to the total current flows through the total number of the energy storage elements, only an energy storage element current equal to the total current divided by the number of energy storage elements flows through each individual one of the energy storage elements. The measurement of the voltage dropped across the energy storage elements 3 by the voltage measuring device 28 and the calculation of the state of charge of the battery 2 by the state of charge monitoring device 29 are carried out as explained with regard to FIG. 1.

Figure 8:
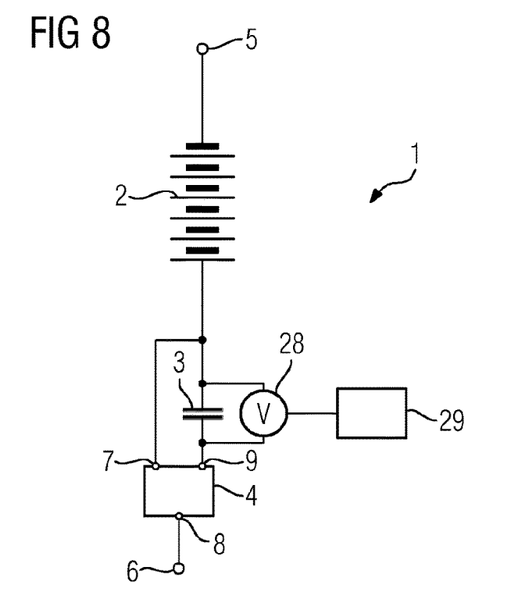
FIG. 8 shows a fourth example embodiment of an energy storage device according to the invention.

FIG. 8 shows a further example embodiment of an energy storage device, in which the state of charge of the battery is determined by the measurement of a voltage drop across an energy storage element 3. In the energy storage device 1 shown in FIG. 8, the energy storage element 3 and the batteries are connected in series. The total current that flows through the energy storage device flows into or out of the connection circuit 4 at the connection contact 8. The connection circuit 4 then divides the current in a predefined ratio between the first connection contact 7 and the third connection contact 9. The current that flows through the third connection contact 9 charges and/or discharges the energy storage element 3. At the same time, however, said current also charges or discharges the battery 2. The current that flows through the first connection contact 7 is led past the energy storage element 3 and charges or discharges exclusively the battery 2. Since the connection circuit 4 in FIG. 8 fulfils the same task as the connection circuit 4 in FIG. 1, the connection circuit can also be constructed identically.

Although the invention has been more specifically illustrated and described in detail by means of the example embodiments, nevertheless the invention is not restricted by the examples disclosed, and other variations can be derived therefrom by the person skilled in the art, without departing from the scope of protection of the invention.

What is claimed is:

1. An energy storage device, comprising:
   a battery having at least one battery cell and two poles,
   two terminal points, each connected directly or indirectly to a respective pole of the battery, for connection to an external electrical circuit for at least one of charging or discharging the battery,
   an energy storage element embodied differently than the battery cell, and
   a connection circuit for directly or indirectly connecting the energy storage element to at least one pole of the battery and at least one terminal point,
   wherein the connection circuit is configured such that the energy storage element is at least one of charged or discharged with an energy storage element current having a predefined ratio to a total current through the energy storage device,
   a voltage measuring device connected to the energy storage element and configured to measure an energy storage voltage of the energy storage element and,
   a state of charge monitoring device configured to determine a state of charge of the battery based at least on the measured energy storage voltage,
   wherein the connection circuit comprises a first connection contact, a second connection contact, and a third connection contact,
   wherein the first connection contact and the second connection contact are connected in series between one of the poles of the battery and the terminal point connected to that pole of the battery, and
   wherein the third connection contact directly or indirectly contacts the energy storage element.

2. The energy storage device of claim 1, wherein the connection circuit is configured such that the total current in defined fractions at least one of originates from the battery and the energy storage element or is supplied to the battery and the energy storage element.

3. The energy storage device of claim 1, wherein each of the third connection contact and the second connection contact or a fourth connection contact directly or indirectly contacts a pole of the energy storage element.

4. The energy storage device of claim 1, wherein the connection circuit comprises a current measuring device configured to measure a battery current flow between the first and second connection contacts.

5. The energy storage device of claim 4, wherein the connection circuit has a current source and/or a current sink between the third connection contact and the second or fourth connection contact, wherein the current source and/or the current sink is controllable depending on the battery current flow.

6. The energy storage device of claim 1, wherein the connection circuit comprises:
   a current measuring device configured to measure a battery current flow between the first and second connection contacts, and
   a current control element configured to determine a current flow through the current control element depending on the battery current flow, between the third connection contact and the second connection contact or a fourth connection contact.

7. The energy storage device of claim 6, wherein at least one of the current control element or the current measuring device comprises at least one transistor.

8. The energy storage device of claim 6, wherein the connection circuit comprises a current mirror, wherein a current flow between the third connection contact and the second or the fourth connection contact is determined by a current flow between the first connection contact and the second connection contact.

9. The energy storage device of claim 1, wherein the connection circuit comprises a DC voltage converter.

10. The energy storage device of claim 1, wherein the connection circuit galvanically isolates the battery from the energy storage element.

11. The energy storage device of claim 1, wherein a plurality of energy storage elements are connected in parallel with each another.

12. The energy storage device of claim 1, wherein the state of charge monitoring device is configured to:
   store a plurality of temporally spaced voltage measurement values and/or determined states of charge of the battery and/or of the energy storage element, and
   calculate the state of charge of the battery based at least on the stored voltage measurement values and/or determined states of charge of the battery and/or of the energy storage element.

13. The energy storage device of claim 1, comprising a current measuring device configured to measure an actual current variable for the current flow through the energy storage device and/or the battery and/or the energy storage element,
   wherein the state of charge monitoring device is configured to calculation of the state of charge of the battery and/or of the energy storage element based at least on the actual current variable and/or temporally preceding actual current variables.

14. The energy storage device of claim 1, wherein the energy storage element voltage for at least one range of the states of charge of the energy storage element has a greater dependence on the state of charge of the energy storage element than a dependence of a voltage of the battery on the state of charge of the battery in an equivalent charging range of the battery.

15. The energy storage device of claim 1, wherein the further energy storage element is an electrochemical storage cell, a capacitor, or a supercapacitor.

16. The energy storage device of claim 15, wherein the supercapacitor is a double-layer capacitor, a hybrid capacitor, or a pseudocapacitor.

* * * * *